US009269892B2

(12) United States Patent
Fujita et al.

(10) Patent No.: US 9,269,892 B2
(45) Date of Patent: Feb. 23, 2016

(54) PLASMA ETCHING METHOD

(71) Applicant: Hitachi High-Technologies Corporation, Minato-ku, Tokyo (JP)

(72) Inventors: Daisuke Fujita, Tokyo (JP); Makoto Suyama, Tokyo (JP); Naohiro Yamamoto, Tokyo (JP); Masato Ishimaru, Tokyo (JP); Kentaro Yamada, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/181,537

(22) Filed: Feb. 14, 2014

(65) Prior Publication Data

US 2015/0017741 A1 Jan. 15, 2015

(30) Foreign Application Priority Data

Jul. 10, 2013 (JP) ................................ 2013-144118

(51) Int. Cl.
*H01L 43/12* (2006.01)
*C23F 4/00* (2006.01)

(52) U.S. Cl.
CPC .. *H01L 43/12* (2013.01); *C23F 4/00* (2013.01)

(58) Field of Classification Search
CPC .................................................. H01L 21/3065
USPC ............................................................ 438/3
See application file for complete search history.

(56) References Cited

U.S. PATENT DOCUMENTS

| 7,948,044 | B2* | 5/2011 | Horng et al. ............... 257/421 |
| 2003/0180968 | A1* | 9/2003 | Nallan et al. ................. 438/3 |
| 2003/0219984 | A1* | 11/2003 | Ying et al. ................ 438/709 |
| 2004/0198062 | A1* | 10/2004 | Ye et al. .................... 438/706 |
| 2012/0276657 | A1* | 11/2012 | Joubert et al. ................. 438/3 |
| 2013/0234267 | A1* | 9/2013 | Kim et al. ................. 257/421 |

FOREIGN PATENT DOCUMENTS

| JP | 2004-356179 A | 12/2004 |
| KR | 10-0814901 B1 | 3/2008 |
| KR | 2013-0024705 A | 3/2013 |
| KR | 2013-0063873 A | 6/2013 |

OTHER PUBLICATIONS

Office Action issued Jan. 26, 2015, in Korean Patent Application No. 10-2014-0013015.

* cited by examiner

*Primary Examiner* — Jerome Jackson, Jr.
*Assistant Examiner* — Ankush Singal
(74) *Attorney, Agent, or Firm* — Miles & Stockbridge P.C.; Eric G. King

(57) ABSTRACT

In a plasma etching method of plasma-etching a sample which has a first magnetic film, a second magnetic film disposed above the first magnetic film, a metal oxide film disposed between the first magnetic film and the second magnetic film, a second metal film disposed over the second magnetic film and forming an upper electrode, and a first metal film disposed below the first magnetic film and forming a lower electrode, the plasma etching method includes the steps of: a first process for etching the first magnetic film, the metal oxide film, and the second magnetic film by using carbon monoxide gas; and a second process for etching the sample by using mixed gas of hydrogen gas and inactive gas after the first process. In this case, the first metal film is a film containing therein tantalum.

12 Claims, 6 Drawing Sheets

PLASMA ETCHING METHOD

BACKGROUND OF THE INVENTION

The present invention relates to a plasma etching method of plasma-etching a magnetic film which is used in a magnetoresistive random access memory or the like.

Along with an increase in an amount of information in recent years, promotion of low power consumption has been required for electronic apparatuses. A semiconductor memory used in the electronic apparatuses has also been required to be a nonvolatile memory which is operated as a high speed and which continues to hold information even when no electric power is supplied thereto from a power source. From these requests, the adaption of a Magnetoresistive Random Access Memory (MRAM) (hereinafter referred to as "an MRAM") is expected as the non-volatile memory which is operated at the low power consumption and at the high speed.

In the manufacture of the MRAM, there is required a technique for micro-fabricating a magnetic film which contains therein at least one of ferromagnetic metals, such as iron (Fe), cobalt (Co), and nickel (Ni), and which is formed on a substrate by a dry etching process using a mask manufactured through a lithography process. The demand for the technique for micro-fabricating the magnetic film by the dry etching process has been increased in the processing as well, for a magnetic head, using the magnetic material.

The methods for etching the magnetic films by the dry etching process include a method using an ion beam etching process, and a method using a plasma etching process. In particular, the plasma etching is widely used in the manufacture of the semiconductor devices, and is excellent in mass productivity because it enables a large-diameter substrate to be uniformly processed. However, when the magnetic film is micro-fabricated by the plasma etching process using halogen system gas such as fluorine (F), chlorine (C) or bromine (Br) which has been heretofore used, the micro-fabrication is difficult to carry out because a vapor pressure of a halogen compound of the magnetic film is low. In addition, it is necessary to specially carry out an anticorrosion treatment because the corrosion is caused when the halogen compound deposited on the magnetic film touches the moisture in the atmosphere.

As far as a method of solving the problems described above, JP-A-2004-356179 discloses a dry etching method of processing a magnetic material while dissociation of a carbon monoxide in plasma is suppressed. This method utilizes that metal carbonyl exhibiting a high vapor pressure is created, and thus is suitable for processing for a magnetic film because corrosion or the like is not caused.

SUMMARY OF THE INVENTION

However, in the etching using carbon monoxide (CO) gas containing therein an oxygen atom (O) as a component, as shown in FIG. 9, deposition of byproducts on both of an etching pattern sidewall and a flat portion is increased after completion of the etching. The byproducts are mainly made of a metal used in an etched film. The byproducts are deposited on the etching pattern sidewall, whereby it is possible that a magnetization free layer and a magnetization fixed layer are electrically short-circuited.

The MRAM is operated based on the principles that data is read out by detecting a current which is being caused to flow between the magnetization free layer and the magnetization fixed layer through a tunnel barrier layer. Therefore, if the magnetization free layer and the magnetization fixed layer are electrically short-circuited to cause the current to flow irrespective of the direction of the magnetization, then, it is impossible to read out the data. For this reason, it is necessary to prevent that the byproducts are deposited on the etching pattern sidewall, thereby electrically short-circuiting the magnetization free layer and the magnetization fixed layer.

In addition, even if neither a carbon atom (C) nor an oxygen atom (O) is contained in the component of the etching gas, when the oxygen atom (O) is contained in a component(s) or a part(s) which is(are) exposed to the plasma within a vacuum chamber, the oxygen atom (O) is mixed into the plasma. For this reason, similarly to the case of the etching using the carbon monoxide (CO) gas, the byproducts containing therein a metal oxide as a principal component are generated on the etching pattern sidewall.

The present invention has been made in order to solve the problems described above, and it is therefore an object of the present invention to provide a plasma etching method with which deposition of byproducts on an etching pattern sidewall can be suppressed.

In order to attain the object described above, according to an embodiment of the present invention, there is provided a plasma etching method of plasma-etching a sample which has a first magnetic film, a second magnetic film disposed above the first magnetic film, a metal oxide film disposed between the first magnetic film and the second magnetic film, a second metal film disposed over the second magnetic film and forming an upper electrode, and a first metal film disposed below the first magnetic film and forming a lower electrode, the plasma etching method including the steps of: a first process for etching the first magnetic film, the metal oxide film, and the second magnetic film by using carbon monoxide gas; and a second process for etching the sample by using mixed gas of hydrogen gas and inactive gas after the first process. In this case, the first metal film is a film containing therein tantalum.

In addition, according to another embodiment of the present invention, there is provided a plasma etching method of plasma-etching a sample which has a first magnetic film, a second magnetic film disposed above the first magnetic film, a metal oxide film disposed between the first magnetic film and the second magnetic film, a second metal film disposed over the second magnetic film and forming an upper electrode, and a first metal film disposed below the first magnetic film and forming a lower electrode, the plasma etching method including the steps of: an etching process for etching the first magnetic film, the metal oxide film, and the second magnetic film by using carbon monoxide gas. In this case, the first metal film is a film containing therein tantalum, the etching process has a first process and a second process which is carried out after the first process, and a bias RF electric power in the second process is smaller than a bias RF electric power in the first process.

As set forth hereinabove, according to the present invention, it is possible to suppress the deposition of the byproducts on the etching pattern sidewall.

Other objects, features and advantages of the invention will become apparent from the following description of the embodiments of the invention taken in conjunction with the accompanying drawings.

DETAILED DESCRIPTION OF THE EMBODIMENTS

Hereinafter, an embodiment of the present invention will be described in detail with reference to FIGS. 1 to 8.

Figure 1:
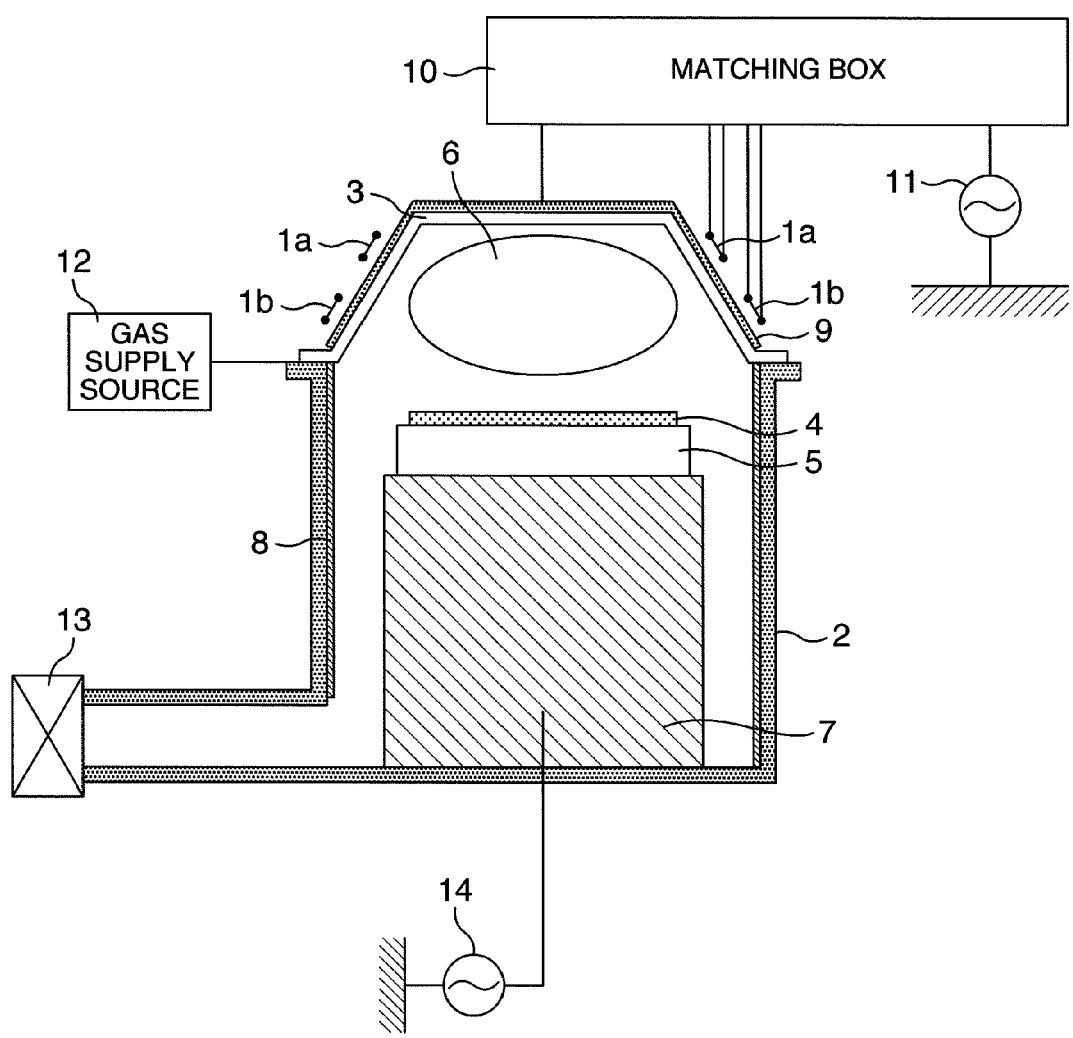
FIG. 1 is a schematic cross-sectional view showing a construction and a configuration of a plasma etching apparatus used in a plasma etching method according to an embodiment of the present invention.

FIG. 1 is a schematic view explaining an outline of a construction and a configuration of a plasma etching apparatus used in a plasma etching method according to an embodiment of the present invention. The plasma etching apparatus in the embodiment of the present invention includes a vacuum chamber 2 composing a processing chamber, a bell-jar 3 made of an insulating material (a non-conducting material such as quartz or ceramics) for closing an upper portion of the vacuum chamber 2, and a sample stage 5 which is disposed inside the vacuum chamber 2 and on which a sample 4 is to be mounted. In this case, the plasma etching apparatus plasma-etches the sample 4 by using plasma 6 generated within the processing chamber.

In addition, the sample stage 5 is formed on a sample holding portion 7 including the sample stage 5. A cover 8 which is installed inside the vacuum chamber 2 is subjected to concave-convex processing in order that byproducts generated by etching the sample 4 may be stuck to a wall surface within the vacuum chamber 2 so as not to be scattered within the vacuum chamber 2. In addition, a coil-shaped first antenna 1a and a coil-shaped second antenna 1b are both disposed outside the bell-jar 3. It is noted that the coil-shaped first antenna 1a is disposed above the coil-shaped second antenna 1b. Moreover, a disc-shaped Faraday shield 9 which is coupled to the plasma 6 in an electrostatic capacitance style is installed outside the bell-jar 3.

The first and second antennas 1a and 1b, and the Faraday shield 9 are all connected to a first radio-frequency power source 11 through a matching box 10. Process gas is supplied from a gas supply source 12 to the vacuum chamber 2. In addition, gas within the vacuum chamber 2 is exhausted so as to obtain a predetermined pressure by a vacuum pumping apparatus 13. A second radio-frequency power source 14 is connected to the sample stage 5. As a result, ions in the plasma 6 can be drawn onto the sample 4.

Figure 2:
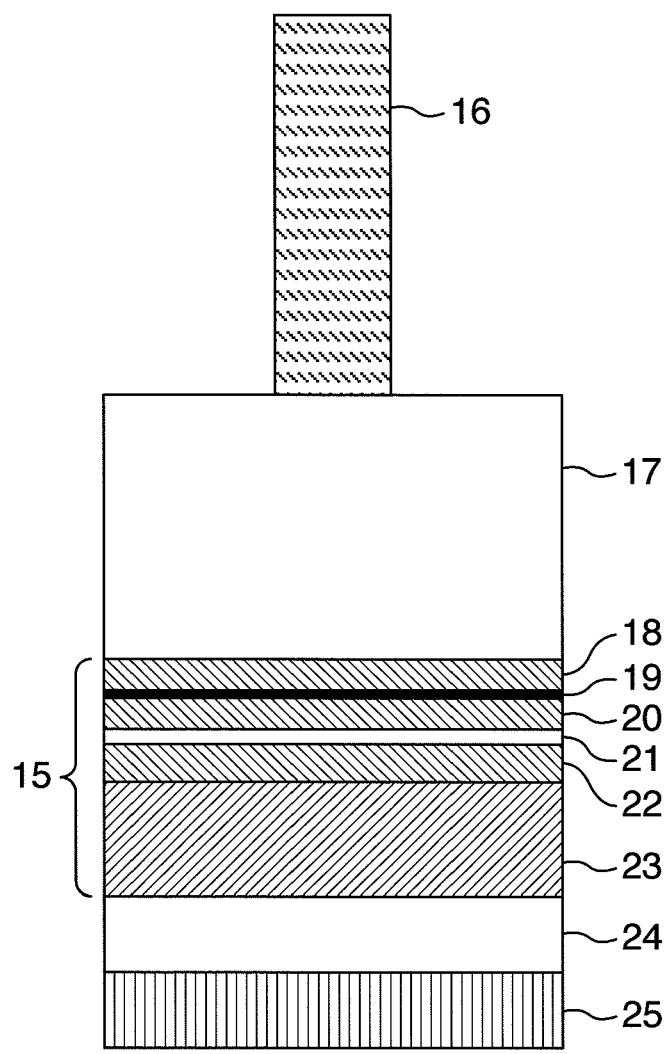
FIG. 2 is a cross-sectional view showing a structure of a sample used in the plasma etching method according to the embodiment of the present invention.

Next, FIG. 2 shows a cross-sectional structure of the sample 4 used in this embodiment of the present invention. The sample 4 has a silicon substrate (not shown) made of silicon. A silicon oxide ($SiO_2$) film 25, a first metal film 24 as a lower electrode composed of a tantalum (Ta) film, an antiferromagnetic exchange bias layer 23, a ferromagnetic layer 22, a non-magnetic layer 21 composed of a ruthenium (Ru) film, a first magnetic film 20 as a magnetization fixed layer, a metal oxide film 19 as a tunnel barrier layer composed of a magnesium oxide (MgO) film, a second magnetic film 18 as a magnetization free layer, a second metal film 17 as an upper electrode composed of a tantalum (Ta) film, and a hard mask 16 which is obtained by previously patterning an original material to a predetermined size are laminated in this order from the lower side on the silicon substrate.

It is noted that the hard mask 16 is composed of a silicon oxynitride (SiON) film, a silicon nitride (SiN) film, a silicon dioxide ($SiO_2$) film or the like. In addition, the lamination film from the antiferromagnetic exchange bias layer 23 to the second magnetic film 18 as the magnetization free layer through the ferromagnetic layer 22, the non-magnetic layer 21 composed of the ruthenium (Ru) film, the first magnetic film 20 as the magnetization fixed layer, and the metal oxide film 19 as the tunnel barrier layer composed of the magnesium oxide (MgO) film is a lamination film composing Magnetic Tunnel Junction (MTJ) (hereinafter referred to as "MTJ"). Thus, this lamination film will be hereinafter referred to as an MTJ element composing film 15.

The antiferromagnetic exchange bias layer 23 is composed of an alloy containing therein platinum (Pt), manganese (Mn), palladium (Pd), and iridium (Ir) as the antiferromagnetic material, and a lamination film. In addition, the antiferromagnetic exchange bias layer 23 is also composed of an alloy film containing therein at least two kinds of metals of cobalt (Co), iron (Fe), and nickel (Ni).

Firstly, a method of etching the second metal film 17 will be described. The second metal film 17 is etched by using mixed gas of tetrafluoromethane ($CF_4$) gas and argon (Ar) gas as shown in TABLE 1 with the hard mask 16 which is obtained by previously patterning the original material to the predetermined size through the sputtering as the mask. Here, a source RF electric power means a radio-frequency electric power which is supplied from the first radio-frequency power source 11 to the first and second antennas 1a and 1b. Also, a bias RF electric power means a radio-frequency electric power which is supplied from the second radio-frequency power source 14 to the sample stage 5.

TABLE 1

| step | gas flow rate (ml/min) | | processing pressure | source RF power | bias RF power | processing time |
| --- | --- | --- | --- | --- | --- | --- |
| | CF4 | Ar | (Pa) | (W) | (W) | sec. |
| 1 | 50 | 30 | 0.3 | 2,400 | 100 | 50 |

When the second metal film 17 is etched by using mixed gas of chlorine ($Cl_2$) gas and tetrafluoromethane ($CF_4$) gas, there is caused a problem that a remaining chlorine component is stuck to a surface of the sample 4, and reacts with the moisture ($H_2O$) in the atmosphere to cause corrosion. Therefore, it is necessary to specially carry out an anticorrosion treatment. In addition, the MTJ element composing film 15 is etched by using mixed gas containing therein ammonia ($NH_3$) gas. In this case, however, there is caused a problem that a remaining chlorine ($Cl_2$) molecule, and a hydrogen (H) atom of the ammonia ($NH_3$) gas react with each other to form hydrogen chloride (HCl), which results in that the corrosion is caused in the peripheral component(s) or part(s) of the vacuum chamber 2 and the gas supply source 12. For this reason, the second metal film 17 and the MTJ element composing film 15 could not be processed in the same vacuum chamber 2.

Figure 3:
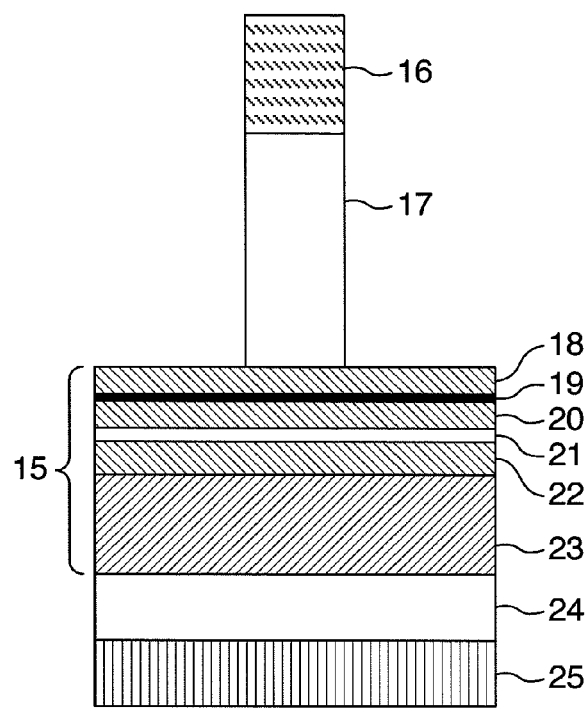
FIG. 3 is a cross-sectional view showing an etching result in a second metal film.

On the other hand, in the case of the plasma etching method of the present invention, no corrosion was caused even when the second metal film 17 and the MTJ element composing film 15 were etched in the same vacuum chamber 2 by using the mixed gas of the tetrafluoromethane ($CF_4$) gas and the argon (Ar) gas. As a result, as shown in FIG. 3, a vertical shape could be obtained. In addition, a remaining film thickness of the hard mask 16 after completion of the etching of the second metal film 17 exerts an influence on a shape of the MTJ element composing film 15 after completion of the etching which is subsequently carried out. Therefore, the remaining film thickness of the hard mask 16 after completion of the etching of the second metal film 17 must be optimized in consideration of the etching for the MTJ element composing film 15.

In this embodiment of the present invention, when the etching for the MTJ element composing film 15 was carried out under the etching conditions in which the remaining film thickness of the hard mask 16 was about 70% of the thickness of the initial hard mask, it was impossible to obtain the desired etching shape because the byproducts which had been generated during the etching for the MTJ element composing film 15 were not scattered, but were stuck to the etching pattern sidewall. Contrary to this, when the etching for the MTJ element composing film 15 is carried out under the etching conditions in which the remaining film thickness of the hard mask 16 is about 10% of the thickness of the initial hard mask, it is possible that during the etching for the MTJ element composing film 15, the second metal film 17 disappears.

For this reason, in this embodiment of the present invention, in order to obtain the desired etching shape after completion of the etching for the MTJ element composing film 15, the remaining film thickness of the hard mask 16 needs be controlled so as to become 30% to 40% of the thickness of the initial hard mask. From such a situation, in the etching conditions shown in TABLE 1, the adjustment of the gas ratio, the adjustment of the bias RF electric power, and the adjustment of the processing time were carried out in such a way that the shape of the second metal film 17 obtained through the etching became the shape suitable for the subsequent etching for the MTJ element composing film 15.

Next, the etching for the MTJ element composing film 15 will be described. Firstly, the second magnetic film 18, the metal oxide film 19, the first magnetic film 20, the non-magnetic layer 21, the ferromagnetic layer 22, and the antiferromagnetic exchange bias layer 23 were etched under the etching conditions in which the processing pressure was set to 0.3 Pa, the source RF electric power was set to 2,400 W, the bias RF electric power was set to 1,000 W, and the processing time was set to 120 seconds by using the mixed gas of ammonia ($NH_3$) gas whose flow rate was set to 85 ml/min, and carbon monoxide (CO) gas whose flow rate was set to 15 ml/min as shown in a step 1 in TABLE 2, with the second metal film 17 as the mask. It is noted that although the MTJ element composing film 15 was the multilayer film, the second magnetic film 18, the metal oxide film 19, the first magnetic film 20, the non-magnetic layer 21, the ferromagnetic layer 22, and the antiferromagnetic exchange bias layer 23 were collectively etched because these layers are each thin.

TABLE 2

| step | gas flow rate (ml/min) | | | | processing pressure (Pa) | source RF power (W) | bias RF power (W) | processing time sec. |
|---|---|---|---|---|---|---|---|---|
| | NH3 | CO | H2 | Ar | | | | |
| 1 | 85 | 15 | — | — | 0.3 | 2,400 | 1,000 | 120 |
| 2 | 85 | 15 | — | — | 0.3 | 2,400 | 450 | 180 |
| 3 | — | — | 70 | 30 | 0.3 | 2,400 | 1,350 | 10 |

Figure 4:
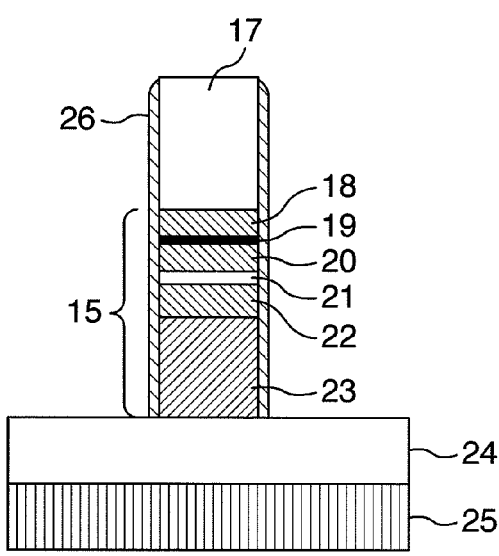
FIG. 4 is a cross-sectional view showing an etching result after processing of a step 1 in TABLE 2.

During the plasma etching in the processing of the step 1 shown in TABLE 2, the sputtering by the mixed gas of the ammonia ($NH_3$) gas and the carbon monoxide (CO) gas, and the creation of metal carbonyl by the carbon monoxide (CO) molecule are generated at the same time on the surface of the sample 4. FIG. 4 shows a cross section of the shape obtained through the etching after completion of the processing of the step 1 shown in TABLE 2. At this time point, as shown in FIG. 4, first byproducts 26 are stuck to the sidewalls of both of the second metal film 17 and the MTJ element composing film 15.

It is thought that since the contribution of the sputtering by the mixed gas of the ammonia ($NH_3$) gas and the carbon monoxide (CO) gas was larger in the plasma etching in the processing of the step 1 shown in TABLE 2 than that of the creation of metal carbonyl by the carbon monoxide (CO) molecules, the metal(s) contained in the MTJ element composing film 15 could not turn into metal carbonyl, and thus the first byproducts 26 were deposited on the sidewall of the etching pattern.

Next, in processing of a step 2 shown in TABLE 2, the removal of the processing of the etching residues in the step 1 described above, and the removal of the first byproducts 26 are both carried out. In the processing of the step 2 shown in TABLE 2, the bias RF electric power was reduced from 1,000 W to 450 W with respect to the processing of the step 1 in TABLE 2 and the processing time was increased from 120 seconds to 180 seconds with respect to the processing of the step 1 in TABLE 2. The reduction of the bias RF electric power makes it possible to reduce the sputtering by the mixed gas of the ammonia ($NH_3$) gas and the carbon monoxide (CO) gas, thereby promoting the creation of metal carbonyl by the carbon monoxide molecules (CO).

Figure 5:
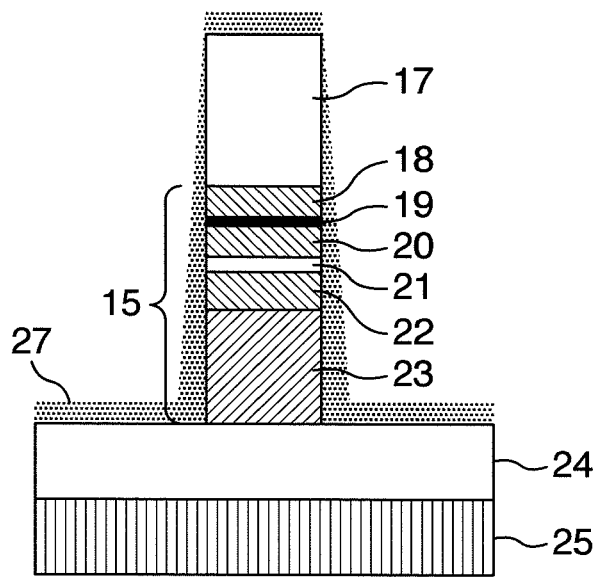
FIG. 5 is a cross-sectional view showing an etching result after processing of a step 2 in TABLE 2.

The sputtering was reduced in such a manner, thereby promoting the creation of metal carbonyl by the carbon monoxide (CO) molecules, whereby the selectivity of the second metal film 17 to the first metal film 24 as the tantalum (Ta) film was increased, and the first byproducts 26 could be removed away while the consumption of both of the second metal film 17 and the first metal film 24 was suppressed. FIG. 5 shows a cross section of a shape obtained through the etching after completion of the processing in the step 2 shown in TABLE 2. Although as shown in FIG. 5, the first byproducts 26 could be removed away, second byproducts 27 different from the first byproducts 26 were deposited on both of the sidewall of the etching pattern, and the flat portion.

It is thought that since the second byproducts 27 could not be removed away under the etching conditions in the processing of the step 2 in TABLE 2, a metal from which metal carbonyl could be created was contained in the second byproducts 27. In addition, metal carbonyl cannot be formed from the first metal film 24, as the tantalum (Ta) film, which is exposed after completion of the etching for the MTJ element composing film 15. Therefore, the first metal film 24 is nonvolatile in the reaction with the mixed gas of the carbon monoxide (CO) gas and the ammonia ($NH_3$) gas.

Moreover, in the case where tantalum (Ta) is scattered based on the sputtering effect, tantalum (Ta) thus scattered reacts with oxygen (O) atoms within the plasma to form a tantalum oxide ($Ta_xO_y$) which is in turn deposited on the etching pattern sidewall. It is thought from those situations that the second byproducts 27 are generally made of the tantalum oxide ($Ta_xO_y$).

In addition, the tantalum oxide ($Ta_xO_y$) is an insulator. However, when tantalum (Ta) which has been discharged to the ambient atmosphere within the vacuum chamber 2 by the sputtering as with this embodiment of the present invention is oxidized to turn into the tantalum oxide ($Ta_xO_y$) which is in turn deposited on the etching pattern sidewall, the resulting tantalum oxide ($Ta_xO_y$) thin film has many structural defects.

For this reason, the tantalum oxide ($Ta_xO_y$) thin film thus formed does not necessarily have the sufficient insulating property. Therefore, when the second byproducts 27 are deposited on the etching pattern, especially, on the sidewall of the MTJ element composing film 15, it is possible that the electrical short-circuit is caused between the second magnetic film 18 and the first magnetic film 20.

Figure 6:
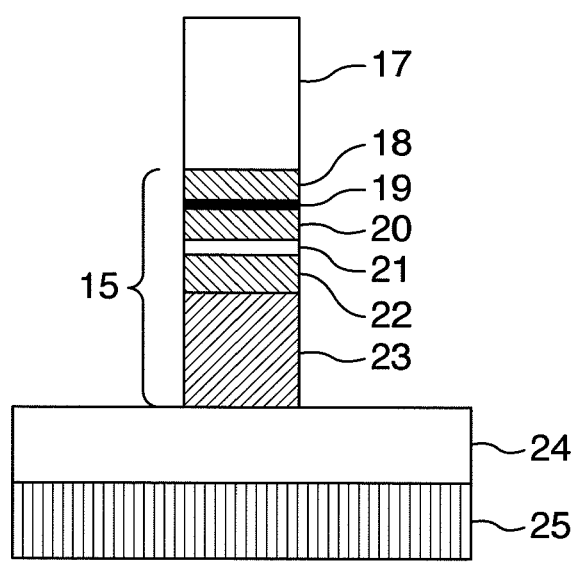
FIG. 6 is a cross-sectional view showing an etching result after processing of a step 3 in TABLE 2.

From such a situation, the plasma etching using the mixed gas of the hydrogen ($H_2$) gas and the argon (Ar) gas was carried out as shown in the processing of the step 3 in TABLE 2 in order to remove away the second byproducts 27. It is noted that the plasma between the processing of the step 2 and the processing of the step 3 in TABLE 2 continuously transited from the processing of the step 2 to the processing of the step 3 without being interrupted. The processing of the step 3 shown in TABLE 2 was executed as shown in FIG. 6, thereby making it possible to remove away the second byproducts 27. The reason for this is thought in the manner as will be described below.

The tantalum oxide ($Ta_xO_y$) as the principal component of the second byproducts 27 is reduced by hydrogen (H) atoms contained in the plasma by using the mixed gas of the hydrogen ($H_2$) gas and the argon (Ar) gas to create both of tantalum (Ta) and water ($H_2O$) molecules, and the water ($H_2O$) molecules are then exhausted. On the other hand, tantalum (Ta) which has been created based on the reductive reaction of the hydrogen (H) atoms with the tantalum oxide ($Ta_xO_y$) is sputtered by the argon (Ar) atoms in the plasma to be exhausted while it is scattered within the vacuum chamber 2. For this reason, it is thought that the second byproducts 27 could be removed away by the etching using the mixed gas of the hydrogen ($H_2$) gas and the argon (Ar) gas.

Figure 7:
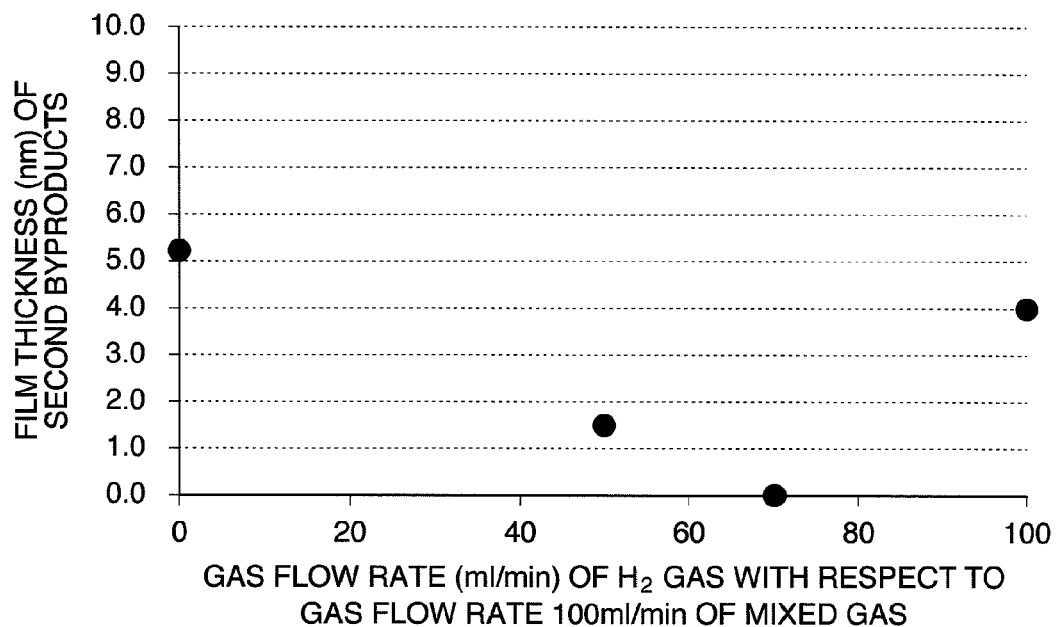
FIG. 7 is a graph showing dependency of a gas flow rate of hydrogen ($H_2$) gas with respect to a gas flow rate of 100 ml/min of mixed gas of hydrogen ($H_2$) gas and argon (Ar) gas, on a film thickness of second byproducts.

It is noted that the gas flow rate of the hydrogen ($H_2$) gas with respect to the gas flow rate of the mixed gas of the hydrogen ($H_2$) gas and the argon (Ar) gas, and the bias RF electric power were determined from the following reason. FIG. 7 is a graph showing dependency of the gas flow rate of the hydrogen ($H_2$) gas with respect to the gas flow rate of 100 ml/min of the mixed gas of the hydrogen ($H_2$) gas and the argon (Ar) gas, on the thickness of the second byproducts 27. In this case, as can be seen from FIG. 7, the thickness of the second byproducts 27 became 0 nm when the flow rate of the hydrogen ($H_2$) gas was set to 70 ml/min, and the flow rate of the argon (Ar) gas was set to 30 ml/min.

For this reason, the flow rate of the hydrogen ($H_2$) gas, and the flow rate of the argon (Ar) gas in the processing of the step 3 shown in TABLE 2 were set to 70 ml/min, and 30 ml/min, respectively. In addition, when the flow rate of the hydrogen ($H_2$) gas, and the flow rate of the argon (Ar) gas are 1:1 (each of these gas flow rates is 50 ml/min), it is possible that the same effect as that in this embodiment of the present invention is obtained by the adjustment of both of the bias RF electric power and the etching time.

Figure 8:
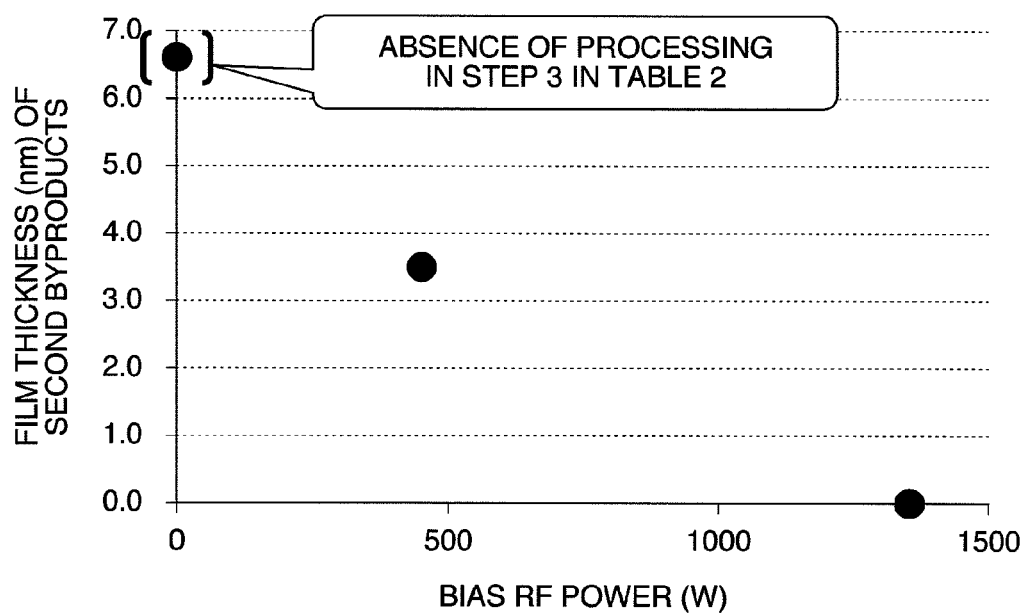
FIG. 8 is a graph showing dependency of a bias RF electric power on the thickness of the second byproducts.
Figure 9:
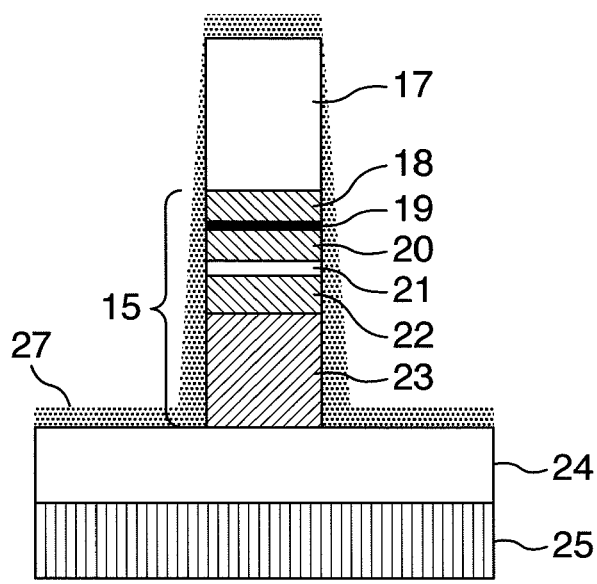
FIG. 9 is a cross-sectional view showing an etching result in a related art.

Next, FIG. 8 is a graph showing dependency of the bias RF electric power on the thickness of the second byproducts 27. In this case, as can be seen from FIG. 8, the thickness of the second byproducts 27 decreased with the increase of the bias RF electric power, and thus the second byproducts 27 proved not to be deposited at the bias RF electric power of 1,350 W. For this reason, the bias RF electric power in the processing of the step 3 shown in TABLE 2 was set to 1,350 W.

In addition, in the present invention, during the transition from the processing of the step 2 to the processing of the step 3 in TABLE 2, the plasma is continuously generated. When the kind of gas is changed to another one while the plasma is continuously generated, it is feared that the plasma becomes unstable or disappears between each adjacent two pieces of processing of the steps. Although not generated in this embodiment of the present invention, a gas replacement step is inserted for about 3 seconds for example before the etching is carried out by using the mixed gas of the hydrogen ($H_2$) gas and the argon (Ar) gas, thereby making it possible to take measures to cope with such a feared point.

For example, after the etching has been carried out by using the mixed gas of the ammonia ($NH_3$) gas and the carbon monoxide (CO) gas, the step of the plasma etching using the mixed gas of the ammonia ($NH_3$) gas and the argon (Ar) gas is inserted as the gas replacement step for 3 seconds. After that, the plasma etching is carried out by using the mixed gas of the hydrogen ($H_2$) gas and the argon (Ar) gas. At this time, to reduce an influence of the gas replacement step exerted on the etching pattern shape after completion of the etching, it is preferable to make small the bias RF electric power in the gas replacement step (for example, 50 W).

In addition, when no processing of the step 3 shown in TABLE 2 was executed, the thickness of the second byproducts 27 deposited on the second metal film 17 was 5 nm, with regard to presence or absence of the second byproducts 27 deposited on the sidewall of the MTJ element composing film 15, presence was shown, and the thickness of the second byproducts 27 deposited on the first metal film 24 was 6.6 nm. On the other hand, however, when the processing of the step 3 shown in TABLE 2 was executed, the thickness of the second byproducts 27 deposited on the second metal film 17 was 1.5 nm, with regard to presence or absence of the second byproducts 27 deposited on the sidewall of the MTJ element composing film 15, absence was shown, and the thickness of the second byproducts 27 deposited on the first metal film 24 was 0 nm.

In this manner, with regard to the etching pattern shape obtained after completion of the etching, in the present invention, the etching is carried out under the etching conditions shown in the processing of the step 3 in TABLE 2, thereby reducing the amount of byproducts. In particular, since there is no deposition of the second byproducts 27 on the sidewall of the MTJ element composing film 15, the electrical short-circuit can be prevented from being caused between the second magnetic film 18 and the first magnetic film 20, thereby obtaining the good magnetoresistance effect. However, either when no electrical short-circuit is caused by the second byproducts 27, or when the second byproducts 27 can be removed away in the manufacturing process other than the etching process, the processing of the step 3 shown in TABLE 2 is not necessarily essential to the present invention.

As described above, even after the etching using the mixed gas of the ammonia ($NH_3$) gas and the carbon monoxide (CO) gas has been carried out by using the technique of the present invention, it is possible to reduce the deposition of the byproducts containing therein the metal oxide as the principal component on both of the etching pattern sidewall and the flat portion.

In addition, the two pieces of processing of the step 1 and the step 2 in this embodiment of the present invention was the example using the mixed gas of the ammonia ($NH_3$) gas and the carbon monoxide (CO) gas. However, since all it takes is that the gas from which metal carbonyl can be created is used in the present invention, mixed gas containing therein the carbon monoxide (CO) gas may also be used. In addition, although the processing of the step 3 in TABLE 2 in this embodiment of the present invention has been described based on the example using the mixed gas of the hydrogen ($H_2$) gas and the argon (Ar) gas, alternatively, in the present invention, inactive gas such as helium gas, nitrogen gas, xenon gas or krypton gas may also be used instead of using the argon gas.

In addition, although in this embodiment of the present invention, the tantalum (Ta) film was used in each of the upper electrode and the lower electrode, for the present invention, all it takes is that a metal film or an alloy film which contains therein at least a tantalum (Ta) atom is used. Moreover, although in this embodiment of the present invention, the magnesium oxide (MgO) was used in the tunnel barrier layer, alternatively, a metal oxide film, for example, an aluminum oxide ($Al_2O_3$) film exhibiting the insulating property may also been used. Furthermore, although in this embodiment of the present invention, the description has been given with respect to the example of the MTJ element structure in which the magnetization free layer is disposed above the magnetization fixed layer, for the present invention, an MTJ element structure in which the magnetization fixed layer is disposed above the magnetization free layer may also be used.

In addition, although the MTJ element structure in this embodiment of the present invention is the structure including the magnetization free layer, the tunnel barrier layer, the magnetization fixed layer, the non-magnetic layer, the ferromagnetic layer, and the antiferromagnetic exchange bias layer. However, all it takes is that the MTJ element structure for the present invention is a structure including the magnetization free layer, the tunnel barrier layer, and the magnetization fixed layer. In addition, with regard to the etching time, a light-emission monitoring device may be provided within the vacuum chamber 2, and the etching times of the upper electrode and the MTJ element composing film 15 may be controlled by using the light-emission monitoring device thus provided.

Moreover, although the above embodiment of the present invention has been described by exemplifying the plasma etching method in which the plasma etching apparatus having the inductivity coupled plasma source is used, the present invention is by no means limited thereto. That is to say, a micro-wave Electron Cyclotron Resonance (ECR) plasma etching apparatus, a plasma etching apparatus having a capacitive coupling type plasma source, or a helicon type plasma etching apparatus may also be used in the present invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching method of plasma-etching a sample which has a first magnetic film, a second magnetic film disposed above said first magnetic film, a metal oxide film disposed between said first magnetic film and said second magnetic film, a second metal film disposed over said second magnetic film and forming an upper electrode, and a first metal film disposed below said first magnetic film and forming a lower electrode, said plasma etching method comprising the steps of:
 a first process for etching said first magnetic film, said metal oxide film, and said second magnetic film by using carbon monoxide gas, with said second metal film as a mask; and
 a second process for etching said sample by using mixed gas of hydrogen gas and inactive gas after the first process,
 wherein said second metal film is a film containing therein tantalum, and
 said first process includes a first etching step and a second etching step which is carried out after said first etching step, and a bias RF electric power in said second etching step is less than a bias RF electric power in said first etching step.

2. The plasma etching method according to claim 1, wherein a bias RF electric power in said second process for etching said sample is greater than a respective bias RF electric power in each of said first and second etching steps of said first etching process.

3. The plasma etching method according to claim 1, wherein before said first process, said second metal film is etched by using mixed gas of tetrafluoromethane gas and argon gas.

4. The plasma etching method according to claim 3, wherein said first process further uses ammonia gas, and said first metal film is a film containing therein tantalum, and the inactive gas used in the second process is argon gas.

5. The plasma etching method according to claim 1, wherein said first process and said second process are carried out in the same processing chamber.

6. The plasma etching method according to claim 1, wherein transition from said first process to said second process is carried out in a state in which the plasma is continuously generated.

7. The plasma etching method according to claim 1 wherein a total processing time in said second process is shorter than a total processing time in said first process.

8. The plasma etching method according to claim 2, wherein a total processing time in said second process is shorter than a total processing time in said first process.

9. The plasma etching method according to claim 3, wherein a total processing time in said second process is shorter than a total processing time in said first process.

10. The plasma etching method according to claim 4, wherein a total processing time in said second process is shorter than a total processing time in said first process.

11. The plasma etching method according to claim 5, wherein a total processing time in said second process is shorter than a total processing time in said first process.

12. The plasma etching method according to claim 6, wherein a total processing time in said second process is shorter than a total processing time in said first process.

* * * * *